US010371753B1

(12) United States Patent
Wang et al.

(10) Patent No.: US 10,371,753 B1
(45) Date of Patent: Aug. 6, 2019

(54) METHODS FOR ONLINE ESTIMATION OF BATTERY CAPACITY AND STATE OF HEALTH

(71) Applicant: HRL Laboratories, LLC, Malibu, CA (US)

(72) Inventors: Shuoqin Wang, Oak Park, CA (US); John Wang, Los Angeles, CA (US); Souren Soukiazian, Burbank, CA (US); Jason A. Graetz, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 217 days.

(21) Appl. No.: 14/578,427

(22) Filed: Dec. 20, 2014

Related U.S. Application Data

(60) Provisional application No. 61/919,384, filed on Dec. 20, 2013.

(51) Int. Cl.
H01M 10/48 (2006.01)
G01R 31/36 (2019.01)
G01R 31/382 (2019.01)

(52) U.S. Cl.
CPC ....... G01R 31/3648 (2013.01); G01R 31/382 (2019.01); H01M 10/48 (2013.01)

(58) Field of Classification Search
CPC .................. H01M 10/48; G01R 31/3648; G01R 31/3606
See application file for complete search history.

(56) References Cited

U.S. PATENT DOCUMENTS

| 5,633,801 A | 5/1997 | Bottman |
| 6,339,334 B1 | 1/2002 | Park |
| 7,015,701 B2 | 3/2006 | Wiegand |
| 7,504,835 B2 | 3/2009 | Byington et al. |
| 7,983,863 B2 | 7/2011 | Jin et al. |

(Continued)

OTHER PUBLICATIONS

Xiao et al., "A universal state-of-charge algorithm for batteries," 47th IEEE Design Automation Conference, Anaheim, CA, 2010.

(Continued)

Primary Examiner — Stephen J Yanchuk
(74) Attorney, Agent, or Firm — O'Connor & Company

(57) ABSTRACT

In some variations, a method of real-time monitoring of battery capacity comprises correlating electrode open-circuit voltage with electrode state of charge for a selected electrode; compiling a look-up table to correlate the electrode open-circuit voltage with the electrode capacity at different values of the active-material capacity; during real-time operation, identifying first and second times at which battery terminal voltages are approximated as battery open-circuit voltages; and calculating battery capacity based on the difference in battery open-circuit voltages at the first and second times, current integration, and the look-up table. No reference electrode is needed, and a complete battery charge/discharge is not necessary to determine the capacity. This technique can therefore be implemented on-board and in real time to provide reliable capacity estimation even as the battery ages. The methods are applicable to various metal-ion secondary battery systems, including lithium-ion batteries, with different material chemistries.

16 Claims, 12 Drawing Sheets

(56) References Cited

U.S. PATENT DOCUMENTS

| | | | |
|---|---|---|---|
| 8,084,996 B2 | 12/2011 | Zhang et al. | |
| 8,116,998 B2 | 2/2012 | Hess et al. | |
| 2012/0105068 A1* | 5/2012 | Wang | H01M 10/0525 324/427 |
| 2013/0138369 A1* | 5/2013 | Papana | G01R 31/3644 702/63 |
| 2013/0335030 A1* | 12/2013 | Joe | H01M 10/052 320/134 |
| 2015/0147614 A1 | 5/2015 | Wang et al. | |

OTHER PUBLICATIONS

Wang et al., "Multi-parameter battery state estimator based on the adaptive and direct solution of the governing differential equations" Journal of Power Sources 196 (2011) 8735-8741.

Kiani, "Online Detection of Faulty Battery Cells in Energy Storage Systems via Impulse Response Method" 978-1-61284-247-9/11 2011 IEEE.

Einhom et al., "A method for online capacity estimation of lithium ion battery cells using the state of charge and the transferred charge," IEEE Transactions on Industry Applications, vol. 48, No. 2, Mar./Apr. 2012.

Weng et al., Abstract, On-board state of health monitoring of lithium-ion batteries using incremental capacity analysis with support vector regression, Journal of Power Sources, vol. 235, Aug. 1, 2013, pp. 36-44.

Wang et al., "Active lithium replenishment to extend the life of a cell employing carbon and iron phosphate electrodes," Journal of Power Sources 196 (2011) 5966-5969.

Deshpande et al., "Battery Cycle Life Prediction with Coupled Chemical Degradation and Fatigue Mechanics," Journal of the Electrochemical Society, 159 (10) A1730-A1738 (2012).

* cited by examiner

FIG. 5

| Li Capacity at Cathode (Ah) | OCV (V) at $Q_{Li}$ = 1.48 Ah | OCV (V) at $Q_{Li}$ = 1.39 Ah | OCV (V) at $Q_{Li}$ = 1.30 Ah | OCV (V) at $Q_{Li}$ = 1.21 Ah | OCV (V) at $Q_{Li}$ = 1.12 Ah | OCV (V) at $Q_{Li}$ = 1.03 Ah |
|---|---|---|---|---|---|---|
| 0.01 | 4.174 | 4.173 | 4.17 | 4.167 | 4.16 | 4.14 |
| 0.02 | 4.162 | 4.161 | 4.158 | 4.154 | 4.146 | 4.133 |
| ⋮ | ⋮ | ⋮ | ⋮ | ⋮ | ⋮ | ⋮ |
| 0.99 | 3.679 | 3.665 | 3.638 | 3.605 | 3.596 | 3.235 |
| 1.00 | 3.673 | 3.657 | 3.629 | 3.599 | 3.584 | 3.075 |
| ⋮ | ⋮ | ⋮ | ⋮ | ⋮ | ⋮ | ⋮ |

FIG. 7

| OCV (V) | Q (Ah) at Cathode, $Q_{Li}$=1.48 Ah | Q (Ah) at Cathode, $Q_{Li}$=1.39 Ah | Q (Ah) at Cathode, $Q_{Li}$=1.30 Ah | Q (Ah) at Cathode, $Q_{Li}$=1.21 Ah | Q (Ah) at Cathode, $Q_{Li}$=1.12 Ah | Q (Ah) at Cathode, $Q_{Li}$=1.03 Ah |
|---|---|---|---|---|---|---|
| 2.80 | 1.453 | 1.365 | 1.277 | 1.188 | 1.100 | 1.012 |
| 2.81 | 1.453 | 1.365 | 1.276 | 1.188 | 1.100 | 1.012 |
| ... | ... | ... | ... | ... | ... | ... |
| 4.14 | 0.042 | 0.040 | 0.038 | 0.033 | 0.0256 | 0.015 |

METHODS FOR ONLINE ESTIMATION OF BATTERY CAPACITY AND STATE OF HEALTH

PRIORITY DATA

This patent application is a non-provisional application with priority to U.S. Provisional Patent App. No. 61/919,384, filed Dec. 20, 2013, which is hereby incorporated by reference herein.

FIELD OF THE INVENTION

The present invention generally relates to systems and methods to monitor the health and capacity of metal-ion batteries.

BACKGROUND OF THE INVENTION

An electrochemical system is a system that either derives electrical energy from chemical reactions, or facilitates chemical reactions through the introduction of electrical energy. An electrochemical system generally includes a cathode, an anode, and an electrolyte, and is typically complex with multiple scales from nanometers to meters. Examples of these systems include batteries and fuel cells. On-line characterization of batteries or fuel cells in vehicles is difficult, due to very rough noisy environments.

On-line characterization of such electrochemical systems is desirable in many applications, which include real-time evaluation of in-flight batteries on a satellite or aviation vehicle, and dynamic diagnostics of traction batteries for electric and hybrid-electric vehicles. In many battery-powered systems, the efficiency of batteries can be greatly enhanced by intelligent management of the electrochemical energy storage system. Management is only possible with proper diagnosis of the battery states.

Accurate estimation of battery capacity is critically important for battery life and health assessment. Especially for on-board applications, the battery state estimations also rely on the capacity information for more accurate estimates of battery states. Not knowing the true capacity of a battery may lead to errors in the battery state calculations, thus adversely affecting the accuracy and robustness of the battery state estimations. Conventionally, the capacity of a cell can be estimated by fully discharging it and integrating the measured current (coulomb counting method). However, for online applications, this is rarely an option. Moreover, good accuracy of the battery capacity estimation is a prerequisite for battery health prognosis, because the battery health estimation relies on the estimates of battery capacity fade over the life of the cell to project its future life.

What are needed are methods and systems that can be implemented on-board and used in real-time, to provide reliable capacity estimation even as a battery ages. It is desirable to provide a method for on-line monitoring of the battery capacity without a reference electrode present, and without the requirement of a complete discharge in order to determine the capacity, which is not suitable for on-line diagnostics. Preferably, such methods and systems are applicable to various metal-ion (e.g., Li-ion) secondary battery systems with different material chemistries.

SUMMARY OF THE INVENTION

In some variations, the invention provides a method of real-time monitoring of battery capacity in a metal-ion battery having an anode and a cathode, the method comprising:

(a) correlating electrode open-circuit voltage with electrode state of charge for a selected electrode;

(b) calculating electrode capacity and active-material capacity;

(c) compiling or obtaining a look-up table, graph, and/or equation to correlate the electrode open-circuit voltage with the electrode capacity at different values of the active-material capacity;

(d) during real-time operation of the battery, identifying first and second times at which battery terminal voltages are approximated as battery open-circuit voltages; and (e) calculating battery capacity based on the difference in battery open-circuit voltages at the first and second times, current integration between the first and second times, and the look-up table, graph, and/or equation provided in step (c).

In some embodiments, the metal-ion battery is a lithium-ion battery and the active-material capacity is recyclable lithium capacity.

The selected electrode may be the anode or the cathode, or the method may be carried out for each of the anode and the cathode.

In some embodiments, step (c) utilizes the look-up table to correlate the electrode open-circuit voltage with the electrode capacity at different values of the active-material capacity.

A non-linear curve minimization technique may be used to acquire the electrode capacity and the active-material capacity at the beginning of life of the battery. In certain embodiments, the non-linear curve minimization technique is a Nelder-Mead technique.

In some embodiments, the method further comprises correlating the difference in the battery capacity at the first and second times with the active-material capacity, based on the battery open-circuit voltages at the first and second times and the look-up table, graph, and/or equation. The active-material capacity, it turn, may be derived from a measured difference in the battery capacity at the first and second times.

In some embodiments, the look-up table, graph, and/or equation to correlate the electrode open-circuit voltage with the electrode capacity at different values of the active-material capacity, is constant during operation and aging of the battery.

In other embodiments, the look-up table, graph, and/or equation to correlate the electrode open-circuit voltage with the electrode capacity at different values of the active-material capacity, changes over the life of the battery. In some methods, step (a) correlates, for the selected electrode, the electrode open-circuit voltage with the electrode state of charge at different values of the active-material capacity. In these or other embodiments, step (a) comprises direct measurements of the electrode open-circuit voltage and the electrode state of charge. In any of these embodiments, step (a) may utilize a beginning-of-life look-up table, graph, and/or equation along with a known voltage fade function.

In certain embodiments of the invention, an approximated value of the active-material capacity is utilized to compile or obtain an updated look-up table, graph, and/or equation that is more accurate than a previous look-up table, graph, and/or equation from step (c). Multiple iterations may be made until the approximated value of the active-material capacity converges, thereby generating an accurate estimate for the battery capacity.

In some embodiments, loss in the active-material capacity dominates loss in the battery capacity. In some embodiments, the battery capacity is limited by amount of metal-ion inventory. In other embodiments, the battery capacity is not limited by amount of metal-ion inventory; and predetermined anode and cathode aging correlations are utilized.

The methods of the invention further include predicting a future battery capacity by extrapolating, in time, the battery capacity calculated in step (e). In some embodiments, the method further comprises estimating battery state of health. When the battery state of health includes the battery capacity as a function of battery age, a future battery state of health may be predicted by extrapolating the battery capacity to a different time (i.e. a future battery age).

Some variations provide an apparatus for real-time monitoring of battery capacity in a metal-ion battery having an anode and a cathode, the apparatus comprising a computer programmed using non-transitory memory with executable code for executing the steps of:

(a) correlating electrode open-circuit voltage with electrode state of charge for a selected electrode;

(b) calculating electrode capacity and active-material capacity;

(c) compiling or obtaining a look-up table, graph, and/or equation to correlate the electrode open-circuit voltage with the electrode capacity at different values of the active-material capacity;

(d) during real-time operation of the battery, identifying first and second times at which battery terminal voltages are approximated as battery open-circuit voltages; and (e) calculating battery capacity based on the difference in battery open-circuit voltages at the first and second times, current integration between the first and second times, and the look-up table, graph, and/or equation provided in step (c).

In some embodiments, the apparatus is linked in operable communication with the battery. The battery may be a lithium-ion battery without a reference electrode, for example. Note that while the battery does not need to include a reference electrode, a third electrode (beyond anode and cathode) may be present for various reasons.

In some embodiments, the apparatus is further configured to predict future battery capacity and future battery state of health. The computer may be programmed for executing the step of predicting a future battery capacity and future battery state of health by extrapolating the battery capacity as a function of battery age.

BRIEF DESCRIPTION OF THE DRAWINGS

FIG. 5 shows a Q/OCV look-up table at different $Q_{Li}$, in Example 1.

FIG. 7 shows a Q/OCV look-up table at different $Q_{Li}$, in Example 1.

DETAILED DESCRIPTION OF EMBODIMENTS OF THE INVENTION

Figure 1:
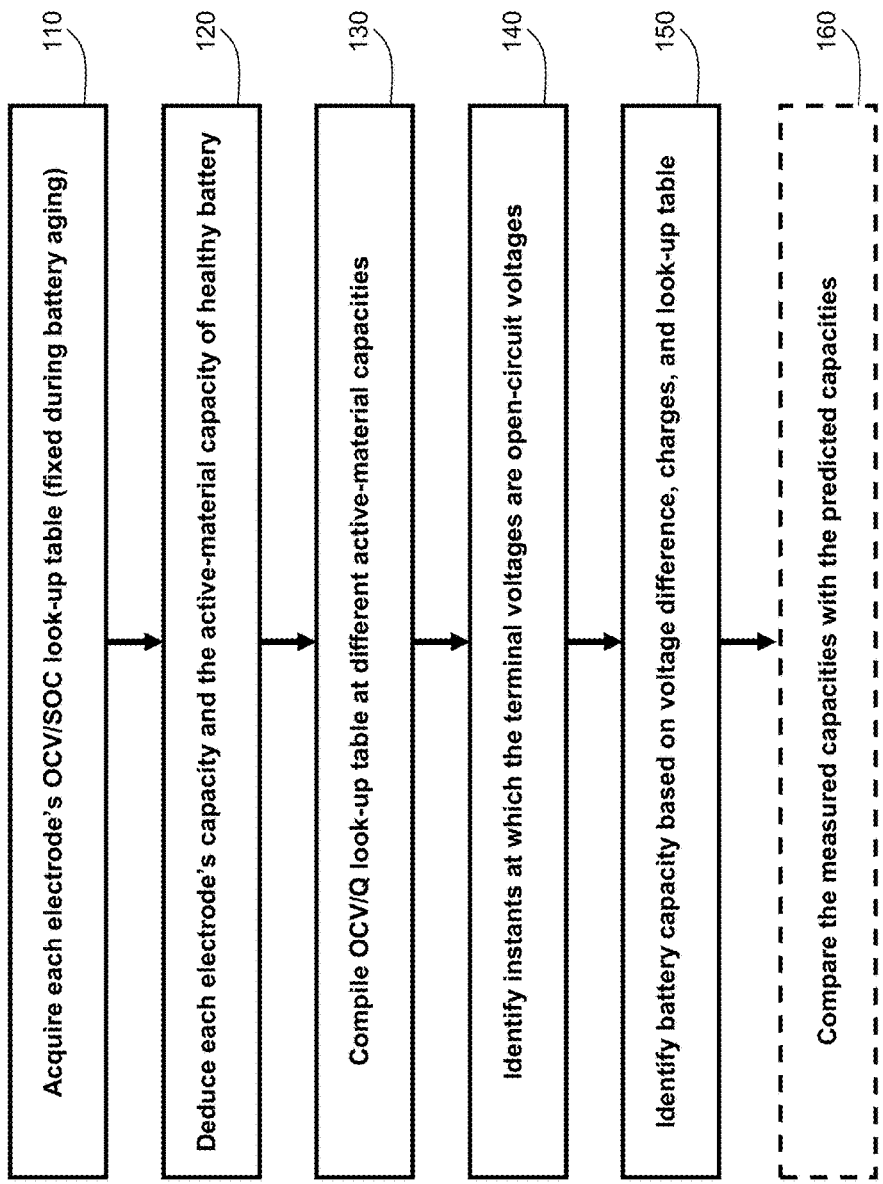
FIG. 1 depicts a flowchart of on-line battery capacity estimation, according to some variations of the invention.

The methods, apparatus, and systems of the present invention will be described in detail by reference to various non-limiting embodiments and figures.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs. As intended herein, "receiving" shall be broadly construed as including "providing," "sensing" (e.g., using a sensor attached to a computer), "calculating" (e.g., using executable code in a computer), and so on.

Unless otherwise indicated, all numbers expressing parameters, conditions, results, and so forth used in the specification and claims are to be understood as being modified in all instances by the term "about." Accordingly, unless indicated to the contrary, the numbers set forth in the following specification and attached claims are approximations that may vary depending upon specific algorithms and calculations.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of."

The invention in some variations is premised on the understanding of aging behavior of lithium-ion batteries at the individual component level (cathode, anode, and active lithium inventory). In particular, some variations of the invention are based, in part, on the discovery that lithium-ion battery aging (and resulting capacity fade) is mainly due to lithium loss, while the electrode material loss is typically minimal.

This disclosure provides a new method for online estimation of capacity and state of health of metal-ion secondary batteries without the need for a reference electrode in the battery. The discovery that capacity fade is primarily attributed to lithium loss (due to side reactions), implies that there is little degradation of the cathode and anode—that is, the cathode or anode material loss is minimal compared with Li loss. Therefore, the open circuit voltage (OCV)—capacity (Q) relationship for each electrode remains essentially constant over the life of the battery. For particular cell chemistry, the relationship between the open circuit voltage and the capacity at the anode or cathode may be measured separately, as a function of active lithium. This relationship may be compiled into a look-up table (LUT) and, if the amount of active lithium is known, can be used to reliably estimate capacity as the battery ages.

This approach does not require a reference electrode or a complete charge or discharge of the cell. As such it can be practically applied to two-electrode batteries and implemented in real time. The OCV/SOC (state of charge) look-up table of each electrode depends only on the physical properties of the electrode material and does not change with age. Once the look-up tables are established, the only parameter that needs to be determined is the amount of active lithium, which can be estimated (for example) by making two open-circuit capacity measurements during battery use.

Embodiments of the present invention will now be described in detail, including reference to the accompanying figures. The figures provide representative illustration of the invention and are not limiting in their content. It will be understood by one of ordinary skill in the art that the scope of the invention extends beyond the specific embodiments depicted. For example, the invention is by no means limited to lithium-ion batteries.

Battery anode capacity, cathode capacity, and total Li capacity may be derived as follows. Since the $SOC_a/OCV_a$ and $SOC_c/OCV_c$ relationships (a=anode, c=cathode) are not changing during battery aging, they can be acquired (e.g., in a laboratory) with a battery having the same chemistry. See Wang et al., *Journal of Power Sources*, (8) 196 (2011), 3942-3948, which is hereby incorporated by reference herein. Now we formulate the battery open-circuit voltage $V_{oc}$ (equivalently, OCV) as $$V_{oc}(Q) = V_{oc}\left(\frac{Q}{Q_c}\right) - V_{oc}\left(\frac{Q_{Li} - Q}{Q_a}\right) \quad \text{(EQ. 1)}$$

where Q, $Q_a$, $Q_c$, and $Q_{Li}$ represent the charge capacity, anode capacity, cathode capacity, and Li capacity, respectively. $V_{oc}(Q)$ can be measured before the battery is used in the field, again noting that the OCV-capacity relationship for each electrode remains essentially constant over the life of the battery. Therefore we can deduce $Q_a$, $Q_c$, and $Q_{Li}$ based on EQ. 1.

Since battery aging is primarily due to a decrease in lithium capacity, $Q_{Li}$, we can deduce a series of $V_{oc}/Q$ look-up tables (LUTs) at different lithium capacities $Q_{Li}$, again based on EQ. 1. We save these LUTs and/or mathematical correlations derived therefrom in computer memory for future battery capacity estimation. During battery in-field usage, two open-circuit moments are identified, at which $V_{oc}$ can be read out. The transferred charge capacity between these two moments can be correlated with $Q_{Li}$ by checking the saved LUTs.

The chart shown in FIG. 1 summarizes an exemplary approach 100. The first three steps 110, 120, 130 in the chart are performed at the beginning of life of the battery, and the steps 140, 150 are implemented for on-line battery capacity estimation. Optionally, the last step 160 can be used for evaluating the method on a test battery.

In some variations, the invention provides a method of real-time monitoring of battery capacity in a metal-ion battery having an anode and a cathode, the method comprising:

(a) correlating electrode open-circuit voltage with electrode state of charge for a selected electrode;

(b) calculating electrode capacity and active-material capacity;

(c) compiling or obtaining a look-up table, graph, and/or equation to correlate the electrode open-circuit voltage with the electrode capacity at different values of the active-material capacity;

(d) during real-time operation of the battery, identifying first and second times at which battery terminal voltages are approximated as battery open-circuit voltages; and (e) calculating battery capacity based on the difference in battery open-circuit voltages at the first and second times, current integration between the first and second times, and the look-up table, graph, and/or equation provided in step (c).

In some embodiments, the metal-ion battery is a lithium-ion battery and the active-material capacity is recyclable lithium capacity. The selected electrode may be the anode or the cathode, or the method may be carried out for each of the anode and the cathode.

In this disclosure, "real time" is intended to mean that characterization (including monitoring and updating) has a time scale of about 1 millisecond ($10^{-3}$ s) or less. Any event happening within about 1 millisecond is considered as happening at the same time, with respect to battery monitoring. Therefore, battery characterization within about 1 millisecond is considered real-time (or delay-free) characterization. The actual time scale of characterization may on the order of $10^{-4}$ s, $10^{-5}$ s, $10^{-6}$ s, or even shorter times, in some embodiments.

In some embodiments, step (c) utilizes the look-up table to correlate the electrode open-circuit voltage with the electrode capacity at different values of the active-material capacity.

A non-linear curve minimization technique may be used to acquire the electrode capacity and the active-material capacity at the beginning of life of the battery. In certain embodiments, the non-linear curve minimization technique is a Nelder-Mead technique.

In some embodiments, the method further comprises correlating the difference in the battery capacity at the first and second times with the active-material capacity, based on the battery open-circuit voltages at the first and second times and the look-up table, graph, and/or equation. The active-material capacity, it turn, may be derived from a measured difference in the battery capacity at the first and second times.

In some embodiments, the look-up table, graph, and/or equation to correlate the electrode open-circuit voltage with the electrode capacity at different values of the active-material capacity, is constant during operation and aging of the battery.

In other embodiments, the look-up table, graph, and/or equation to correlate the electrode open-circuit voltage with the electrode capacity at different values of the active-material capacity, changes over the life of the battery. In some methods, step (a) correlates, for the selected electrode, the electrode open-circuit voltage with the electrode state of charge at different values of the active-material capacity. In these or other embodiments, step (a) comprises direct measurements of the electrode open-circuit voltage and the electrode state of charge. In any of these embodiments, step (a) may utilize a beginning-of-life look-up table, graph, and/or equation along with a known voltage fade function.

In certain embodiments of the invention, an approximated value of the active-material capacity is utilized to compile or obtain an updated look-up table, graph, and/or equation that is more accurate than a previous look-up table, graph, and/or equation from step (c). Multiple iterations may be made until the approximated value of the active-material capacity converges, thereby generating an accurate estimate for the battery capacity.

In some embodiments, loss in the active-material capacity dominates loss in the battery capacity. In some embodiments, the battery capacity is limited by amount of metal-ion inventory. In other embodiments, the battery capacity is not limited by amount of metal-ion inventory; and predetermined anode and cathode aging correlations are utilized.

The methods of the invention further include predicting a future battery capacity by extrapolating, in time, the battery capacity calculated in step (e). In some embodiments, the method further comprises estimating battery state of health. When the battery state of health includes the battery capacity as a function of battery age, a future battery state of health may be predicted by extrapolating the battery capacity to a different time (i.e. a future battery age).

In some embodiments, the first and second times are selected such that the battery current is about 0 (such as less than 0.01 A, 0.005 A, 0.004 A, 0.003 A, 0.002 A, or 0.001 A). The first and second anode open-circuit voltages may each be estimated from anode voltage at the first and second times, when the battery current is about 0 (such as less than 0.01 A, 0.005 A, 0.004 A, 0.003 A, 0.002 A, or 0.001 A). Also, the first and second cathode open-circuit voltages may each be estimated from cathode voltage at these first and second times.

In certain embodiments, the battery current is about 0 for at least 1, 2, 3, 4, 5, 6, 7, 8, 9, or 10 minutes prior to recording each of the first and second measured anode or cathode voltage as each of the first and second electrode open-circuit voltages.

In some embodiments, the first and second anode open-circuit voltages are correlated to the first and second anode states of charge using a look-up table, graph, equation, or combination thereof. In these or other embodiments, the first and second cathode open-circuit voltages are correlated to the first and second cathode states of charge using a look-up table, graph, equation, or combination thereof.

In some embodiments, anode voltage signals and/or cathode voltage signals are compared, in the computer, to predetermined voltage safety limits of the anode and/or the cathode, respectively. In these or other embodiments, the anode and/or cathode voltage derivative with respect to time or with capacity are/is compared, in the computer, to predetermined differential voltage safety limits of the anode and/or the cathode, respectively.

The anode capacity may be determined as constant-discharge current multiplied by the time period for discharging anode voltage from its minimum to maximum. The cathode capacity may be determined as constant-discharge current multiplied by the time period for discharging cathode voltage from its minimum to maximum.

In certain embodiments, additional data inputs (beyond current and voltage) are considered in the model and algorithms. Additional data inputs may relate to ambient conditions of the local environment, including temperature, pressure, relative humidity, and electromagnetic interference patterns, for instance. Additional data inputs may be based on previous experience with similar devices, or other ways to capture prior knowledge to improve the accuracy of the diagnostics for the intended purpose. These additional data inputs may be quantitative or qualitative in nature.

Some variations provide an apparatus for real-time monitoring of battery capacity in a metal-ion battery having an anode and a cathode, the apparatus comprising a computer programmed using non-transitory memory with executable code for executing the steps of:

(a) correlating electrode open-circuit voltage with electrode state of charge for a selected electrode;

(b) calculating electrode capacity and active-material capacity;

(c) compiling or obtaining a look-up table, graph, and/or equation to correlate the electrode open-circuit voltage with the electrode capacity at different values of the active-material capacity;

(d) during real-time operation of the battery, identifying first and second times at which battery terminal voltages are approximated as battery open-circuit voltages; and (e) calculating battery capacity based on the difference in battery open-circuit voltages at the first and second times, current integration between the first and second times, and the look-up table, graph, and/or equation provided in step (c).

In some embodiments, the apparatus is linked in operable communication with the battery. The battery may be a lithium-ion battery without a reference electrode, for example. Note that while the battery does not need to include a reference electrode, a third electrode (beyond anode and cathode) may be present for various reasons.

In some embodiments, the apparatus is further configured to predict future battery capacity and future battery state of health. The computer may be programmed for executing the step of predicting a future battery capacity and future battery state of health by extrapolating the battery capacity as a function of battery age.

The "computer" utilized in the apparatus is any programmable computing device, or plurality of devices which may be distributed in time or space, capable of being programmed (such as using C++ programming language) or otherwise caused to execute code for executing the steps of any of the methods or algorithms described herein. The algorithm may be embedded within a controller.

In some embodiments, the computer has a processor, an area of main memory for executing program code under the direction of the processor, a storage device for storing data and program code and a bus connecting the processor, main memory, and the storage device; the code being stored in the storage device and executing in the main non-transient memory under the direction of the processor, to perform the steps of the methods or algorithms recited in this description. Optionally, the computer may be configured to exchange data with a network (such as the Internet), and may carry out calculations on remote computers, servers, or via cloud computing.

Figure 2:
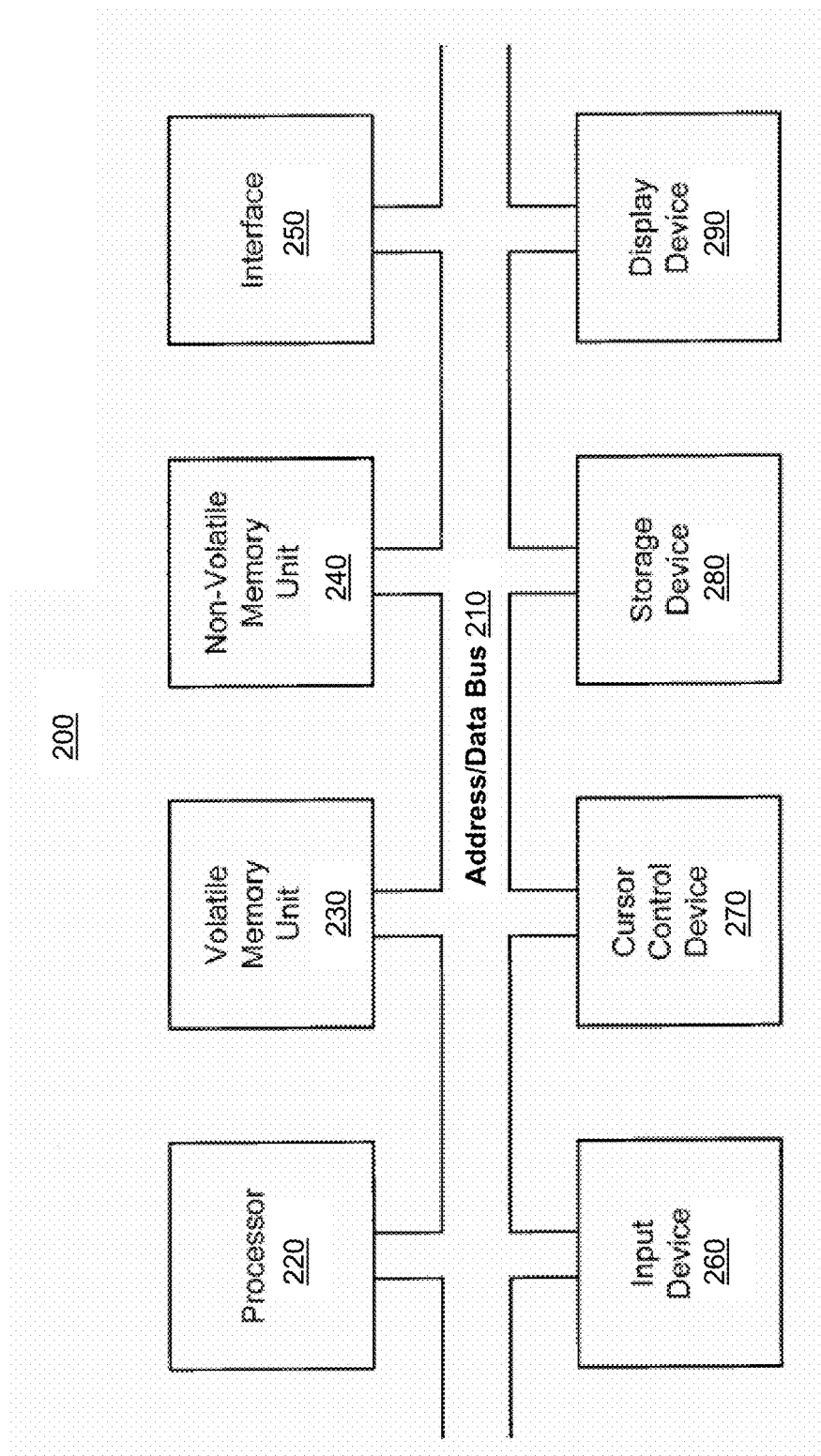
FIG. 2 shows a simplified schematic of an exemplary computer system that may be utilized in some embodiments.

An exemplary computer system 200 in accordance with some embodiments is shown in FIG. 2. Exemplary computer system 200 is configured to perform calculations, processes, operations, and/or functions associated with a program or algorithm. In some embodiments, certain processes and steps discussed herein are realized as a series of instructions (e.g., software program) that reside within computer-readable memory units and are executed by one or more processors of exemplary computer system 200. When executed, the instructions cause exemplary computer system 200 to perform specific actions and exhibit specific behavior, such as described herein.

Exemplary computer system 200 may include an address/data bus 210 that is configured to communicate information. Additionally, one or more data processing units, such as processor 220, are coupled with address/data bus 210. Processor 220 is configured to process information and instructions. In some embodiments, processor 220 is a microprocessor. Alternatively, processor 220 may be a different type of processor such as a parallel processor, or a field-programmable gate array.

Exemplary computer system 200 is configured to utilize one or more data-storage units. Exemplary computer system 200 may include a volatile memory unit 230, such as (but not limited to) random access memory ("RAM"), static RAM, or dynamic RAM, coupled with address/data bus 210, wherein volatile memory unit 230 is configured to store information and instructions for processor 220. Exemplary computer system 200 further may include a non-volatile memory unit 240, such as (but not limited to) read-only memory ("ROM"), programmable ROM ("PROM"), erasable programmable ROM ("EPROM"), electrically erasable programmable ROM "EEPROM"), or flash memory (e.g., in a memory stick or other removable flash memory card formats) coupled with address/data bus 210, wherein non-volatile memory unit 240 is configured to store static information and instructions for processor 220. Alternatively exemplary computer system 200 may execute instructions retrieved from an online data-storage unit such as in "cloud computing."

In some embodiments, exemplary computer system 200 also may include one or more interfaces, such as interface 250, coupled with address/data bus 210. The one or more interfaces are configured to enable exemplary computer system 200 to interface with other electronic devices and computer systems. The communication interfaces implemented by the one or more interfaces may include wireline (e.g., serial cables, modems, network adaptors, etc.) and/or wireless (e.g., wireless modems, wireless network adaptors, etc.) communication technology.

In some embodiments, exemplar computer system 200 may include an input device 260 coupled with address/data bus 210, wherein input device 260 is configured to communicate information and command selections to processor 220. In accordance with certain embodiments, input device 260 is an alphanumeric input device, such as a keyboard, that may include alphanumeric and/or function keys. Alternatively, input device 260 may be an input device other than an alphanumeric input device. In some embodiments, exemplar computer system 200 may include a cursor control device 270 coupled with address/data bus 210, wherein cursor control device 270 is configured to communicate user input information and/or command selections to processor 220. A cursor control device 270 may be implemented using a device such as a mouse, a track-ball, a track-pad, an optical tracking device, or a touch screen. A cursor control device 270 may alternatively, or additionally, be directed and/or activated via input from input device 260, such as in response to the use of special keys and key sequence commands associated with input device 260. Alternatively, or additionally, cursor control device 270 may be configured to be directed or guided by voice commands.

In some embodiments, exemplary computer system 200 further may include one or more optional computer-usable data-storage devices, such as storage device 280, coupled with address/data bus 210. Storage device 280 is configured to store information and/or computer-executable instructions. In some embodiments, storage device 280 is a storage device such as a magnetic or optical disk drive, including for example a hard disk drive ("HDD"), floppy diskette, compact disk read-only memory ("CD-ROM"), or digital versatile disk ("DVD"). In some embodiments, a display device 290 is coupled with address/data bus 210, wherein display device 290 is configured to display video and/or graphics. Display device 290 may include a cathode ray tube ("CRT"), liquid crystal display ("LCD"), field emission display ("FED"), plasma display or any other display device suitable for displaying video and/or graphic images and alphanumeric characters recognizable to a user.

Exemplary computer system 200 is presented herein as an exemplary computing environment in accordance with some embodiments. However, exemplary computer system 200 is not strictly limited to being a computer system. For example, exemplary computer system 200 may represent a type of data processing analysis that may be used in accordance with various embodiments described herein. Moreover, other computing systems may also be implemented. Indeed, the spirit and scope of the present technology is not limited to any single data processing environment. Thus, in some embodiments, one or more operations of various embodiments are controlled or implemented using computer-executable instructions, such as program modules, being executed by a computer. Such program modules may include routines, programs, objects, components and/or data structures that are configured to perform particular tasks or implement particular abstract data types. In addition, in some embodiments, one or more aspects are implemented by utilizing distributed computing environments, such as where tasks are performed by remote processing devices that are linked through a communications network, or such as where various program modules are located in both local and remote computer-storage media including memory-storage devices.

Some embodiments provide computer-readable medium containing program instructions for monitoring of battery capacity in a metal-ion battery having an anode and a cathode, wherein execution of said program instructions by one or more processors of a computer causes said one or more processors to carry out the steps of:

(a) correlating electrode open-circuit voltage with electrode state of charge for a selected electrode;

(b) calculating electrode capacity and active-material capacity;

(c) compiling or obtaining a look-up table, graph, and/or equation to correlate the electrode open-circuit voltage with the electrode capacity at different values of the active-material capacity;

(d) during real-time operation of the battery, identifying first and second times at which battery terminal voltages are approximated as battery open-circuit voltages; and (e) calculating battery capacity based on the difference in battery open-circuit voltages at the first and second times, current integration between the first and second times, and the look-up table, graph, and/or equation provided in step (c).

Some embodiments provide a system in which the apparatus, described above, is linked in operable communication with the battery (such as, but not limited to, a lithium-ion battery).

The primary functional components of a typical lithium-ion battery are the anode, cathode, and electrolyte, in which a lithium ion moves between the anode and cathode in the electrolyte. A separator is used to separate cathode and anode to prevent electron shortage. Current collectors, normally metal, are used to collect electrons from both cathode and anode. The lithium ion moves from the anode to the cathode during discharge and from the cathode to the anode when charging.

Both the anode and cathode are materials into which and from which lithium can migrate. The process of lithium moving into the anode or cathode is referred to as insertion (or intercalation), and the reverse process, in which lithium moves out of the anode or cathode is referred to as extraction (or deintercalation). The cathode and anode should be electronically separated by a separator, but ionically connected with electrolyte.

Battery capacity is primarily determined by the amount of active lithium traveling between the anode and the cathode. When the battery is charged for the first time, lithium leaves the cathode and enters the anode. After all removable lithium leaves the cathode, only part of that lithium is active in the anode because some lithium will typically be lost to form a solid-state electrolyte interface on the anode surface. During subsequent battery cycles, the amount of active lithium will be smaller than the storage capacity of both the cathode and the anode. Consequently, lithium battery capacity is usually equal to the amount of active lithium. Corrosion of this active lithium during the life of the battery leads directly to capacity loss.

In preferred embodiments, the metal ions are lithium ions. The anode material must be capable of incorporating lithium ions during battery charging, and then releasing the lithium ions during battery discharge. Exemplary anode materials suitable for the present invention include, but are not limited to, carbon materials such as graphite, coke, soft carbons, and hard carbons; and metals such as Si, Al, Sn, or alloys thereof. Other exemplary anode materials include titanium oxides, germanium, copper/tin, and lithium compounds containing metal oxides, such as oxides of W, Fe, and Co. Anodes can also include fillers and binders. The anode material preferably exhibits long cycle life and calendar life, and does not experience significant resistance increase throughout the life of the battery.

Preferably, the anode material consists essentially of graphitic carbon or another electron-conducting carbon. Some examples of electron-conducting carbon include natural graphites, such as flaky graphite, plate-like graphite, and other types of graphite; high-temperature sintered carbon products obtained, for example, from petroleum coke, coal coke, celluloses, saccharides, and mesophase pitch; artificial graphites, including pyrolytic graphite; carbon blacks, such as acetylene black, furnace black, Ketjen black, channel black, lamp black, and thermal black; asphalt pitch, coal tar, active carbon, mesophase pitch, and polyacetylenes.

The cathode material must be capable of supplying lithium ions during battery charging, and then incorporating the lithium ions during battery discharge. The cathode material can be, for example, a lithium metal oxide, phosphate, or silicate. Exemplary cathode materials suitable for the present invention include, but are not limited to, $LiMO_2$ (M=Co, Ni, Mn, or combinations thereof); $LiM_2O_4$ (M=Mn, Ti, or combinations thereof); $LiMPO_4$ (M=Fe, Mn, Co, or combinations thereof); and $LiM_xM'_{2-x}O_4$ (M, M'=Mn or Ni). The cathode material preferably exhibits long cycle life and calendar life, and does not experience significant resistance increase throughout the life of the battery.

The cathode may further include one or more conductive fillers to provide enhanced electronic conductivity. Examples of conductive fillers include, but are not limited to, conductive carbons, graphites, activated carbon fibers, non-activated carbon nanofibers, metal flakes, metal powders, metal fibers, carbon fabrics, metal mesh, and electrically conductive polymers. The cathode may also further comprise other additives such as, for example, alumina, silica, and transition-metal chalcogenides.

The cathode may also include a binder. The choice of binder material may vary widely so long as it is inert with respect to the other materials in the cathode. Useful binders are materials, usually polymeric, that allow for ease of processing of battery electrode composites and are generally known to those skilled in the art of electrode fabrication. Examples of useful binders include, but are not limited to, polytetrafluoroethylenes, polyvinylidene fluorides, ethylene-propylene-diene rubbers, polyethylene oxides, acrylates, methacrylates, divinyl ethers, and the like.

Current collectors collect electrical current generated and provide an efficient surface for attachment of electrical contacts leading to the external circuit. The current collectors may be made from any suitable materials, such as (but not limited to) Al, Cu, Ni, C, Ti, Au, or Pt. The current collectors may also be fabricated from alloys, such as stainless steel. Some embodiments employ conducting carbonaceous materials for current collectors. Current collectors may be porous or non-porous, such as 5-50 μm thick metal foils.

Current collector also collects electrical current generated and provides an efficient surface for attachment of electrical contacts leading to the external circuit. The current collector may be porous to allow ion communication through the cathode (or another electrode, in other embodiments). A porous current collector allows lithium ions to be transported through the material, in the direction of ion flow. Preferred forms of porous current collectors include, but are not limited to, mesh, foam, grids, nets, woven fibers, honeycombs, patterned or perforated holes on metal foil, metallized plastic films, expanded metal grids, metal wools, woven carbon fabrics, woven carbon meshes, non-woven carbon meshes, and carbon felts, and structured patterns such as micro-trusses. The pore size in porous current collectors may vary, such as from about 1 nm to about 10 μm. Pores may be imparted into current collectors by etching or some other means. The holes may be round, square, or some other shape.

Separators can be fabricated from any suitable material. Examples include cellulosic materials (e.g., paper), non-woven fabrics (e.g., cellulose/rayon non-woven fabric), microporous resin films, and porous metal foils. The separator can be an insulating thin film that is high in ion permeability and that has a prescribed mechanical strength. As the material of the separator, an olefin polymer, a fluorine-containing polymer, a cellulose polymer, a polyimide, a nylon, glass fiber, or alumina fiber, in the form of a non-woven fabric, a woven fabric, or a microporous film, may be used.

Lithium-ion batteries include a liquid electrolyte to conduct lithium ions. The liquid electrolyte acts as a carrier between the cathode and the anode when the battery passes an electric current through an external circuit, and also between the lithium reference electrode and the cathode or anode in accordance with this invention. Liquid or gel electrolytes may be employed. The electrolyte may be aqueous or nonaqueous.

The electrolyte generally includes a solvent and a lithium salt (anion plus lithium cation). Examples of the solvent that can be used include aprotic organic solvents, such as propylene carbonate, ethylene carbonate, butylene carbonate, dimethyl carbonate, diethyl carbonate, methyl ethyl carbonate, γ-butyrolactone, methyl formate, methyl acetate, 1,2-dimethoxyethane, tetrahydrofuran, 2-methyltetrahydrofuran, dimethyl sulfoxide, 1,3-dioxolane, formamide, dimethylformamide, dioxolane, dioxane, acetonitrile, nitromethane, ethyl monoglyme, phosphoric triesters, trimethoxymethane, dioxolane derivatives, sulfolane, 3-methyl-2-oxazolidinone, propylene carbonate derivatives, tetrahydrofuran derivatives, ethyl ether, 1,3-propanesultone, N-methyl acetamide, acetonitrile, acetals, ketals, sulfones, sulfolanes, aliphatic ethers, cyclic ethers, glymes, polyethers, phosphate esters, siloxanes, dioxolanes, and N-alkylpyrrolidones. Ethylene carbonate and propylene carbonate are preferable. As is known in the art, other minor components and impurities can be present in the electrolyte composition.

Lithium salts include, but are not limited to, $LiClO_4$, $LiBF_4$, $LiPF_6$, $LiCF_3SO_3$, $LiCF_3CO_2$, $LiAsF_6$, $LiSbF_6$, $LiAlCl_4$, $LiCl$, $LiBr$, and $LiI$, which may be used alone or as a mixture of two or more. $LiBF_4$ and $LiPF_6$ are preferable, in some embodiments. The concentration of the salt is not particularly limited, but preferably is about 0.1 to 5 mol/L of the electrolytic solution.

The amount of electrolytes to be used in the battery may vary. Preferred amounts will depend on the amounts of the cathode and anode active material and the size of the battery.

The battery can be packaged into either prismatic format cells or cylindrical cells. In the prismatic format, the stacked structure is preferably sealed with a packaging material capable of preventing air and water contamination of the battery. Three terminals should be employed to allow electrical access to the battery—terminals for each of the cathode, the anode, and the lithium reference electrode.

In a cylindrical format, a multi-layered structure will be wound into a jelly roll. The lithium reference electrode layer can be placed in the outmost layer, or another layer. The jelly roll can be sealed in a metal container after battery electrolyte is added.

Generally, any of the multi-layered battery structures described herein may be repeated to increase the total capacity of the battery. It should be noted that many battery configurations are possible. Although a reference electrode is not necessary, one may be included. A spare electrode may also be included which may function as either a reference electrode or as a backup anode or cathode, if needed.

Lithium-ion batteries are typically included in a battery pack, which includes a plurality of electrochemical cells that are electrically connected in series and/or in parallel. Lithium-ion battery packs come in many shapes, sizes, capacities, and power ratings, depending on the intended use of the battery pack. Battery packs will typically include a number of lithium-ion cells and a thermal-management system. Open space or a heat-absorbing material may be incorporated between cells, to avoid excessive heating. Or, ceramic plates may be included between each cell, for example. A vent may be added to the battery box in case of thermal runaway reactions. In preferred embodiments utilizing this invention, the engineering overhead for thermal management is reduced by anode/cathode monitoring, thus increasing the effective system energy density.

Lithium-ion batteries according to this invention can be suitable for operating across a variety of temperature ranges. The temperature of lithium-ion battery operation can vary, as is known. Exemplary operation temperatures can be from −50° C. to 80° C., such as for military applications. For computers and related devices, as well as for electric-vehicle applications, an exemplary operation range is −30° C. to 60° C.

The scope of the invention, as mentioned above, is beyond lithium-ion batteries. In particular, the battery electrodes may be based on sodium (Na), potassium (K), or magnesium (Mg), for example. When alternative ions (other than $Li^+$) are employed, the reference electrode material should contain the alternative ions (e.g., $Na^+$, $K^+$, or $Mg^{2+}$).

EXAMPLES

We have conducted the following experiments to demonstrate on-line battery capacity estimation using the principles of this invention.

Example 1: Correlation of Open-Circuit Voltage with Capacity

A Sanyo 18650 cylindrical cell is used in this experiment. It is composed of NiCoMn-based composite ($LiMn_{1/3}Ni_{1/3}Co_{1/3}+LiMn_2O_4$) positive electrode (cathode) and a graphite negative electrode (anode). At the beginning of life, the battery has a typical capacity of approximately 1.5 Ah.

It is first desired to compile a look-up table that compiles the full cell open-circuit voltage as a function of capacity. The first step of the procedure involves measuring the OCV as a function of SOC for each electrode using a half cell or a full cell with a reference electrode. In the next step, the capacity of each electrode and the amount of active material (i.e., Li) is determined in the pristine state. This data is used to compile look-up tables for the full cell OCV vs. capacity with different amounts of active material using EQ. 1. Note that these steps in this Example 1 need only be performed once for a given cell chemistry. Once the look-up table is established, it can be used with a battery management system on any battery, composed of the same materials, to determine the battery capacity on-board and in real time.

Figure 3B:
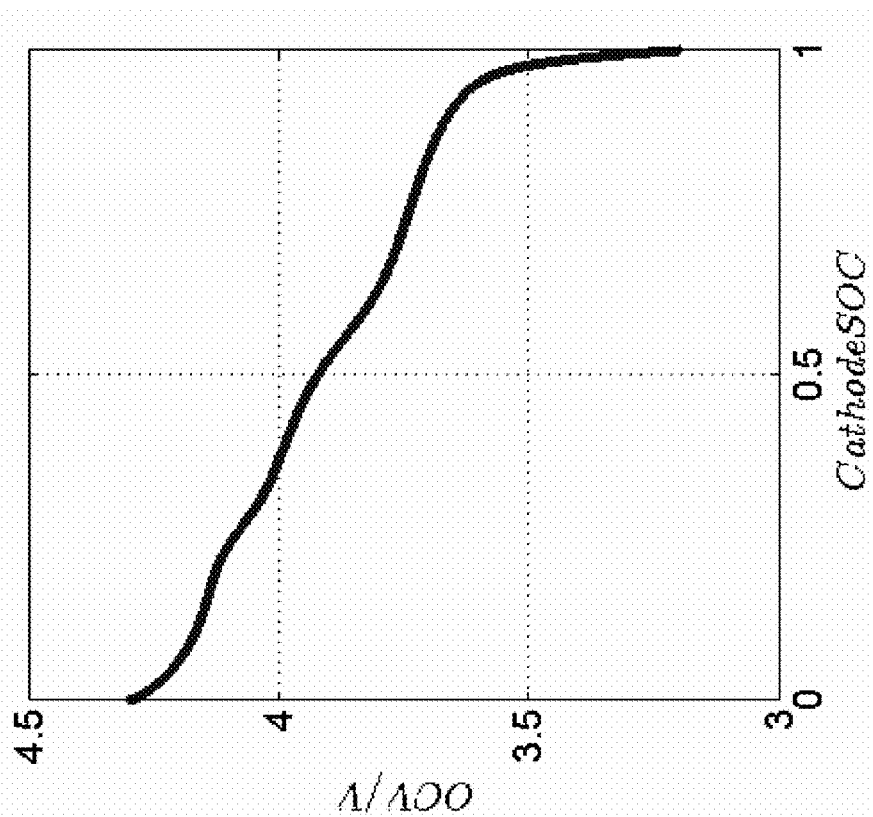
FIG. 3B gives an experimental $SOC_c/OCV_c$ relationship in Example 1.
Figure 3A:
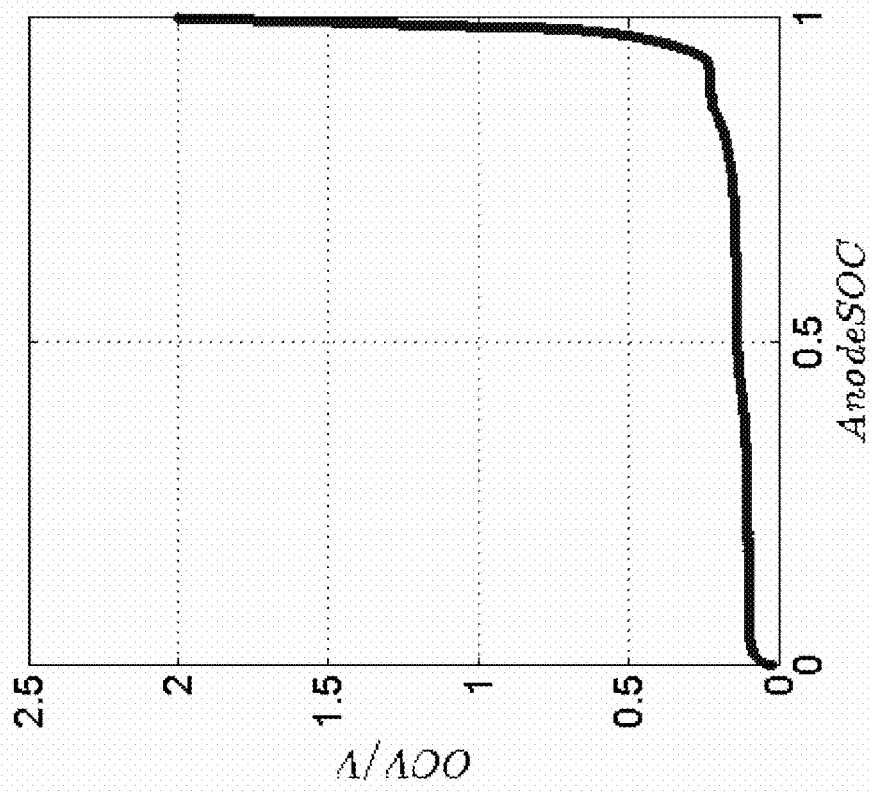
FIG. 3A gives an experimental $SOC_a/OCV_a$ relationship in Example 1.

Acquire SOC/OCV Relationship for Each Electrode, i.e., $SOC_a/OCV_a$ and $SOC_c/OCV_c$ The technique in the reference Wang et al., *Journal of Power Sources* (8) 196 (2011), 3942-3948 is used to acquire these two curves (one relating $SOC_a$ with $OCV_a$ and one relating $SOC_c$ with $OCV_c$. The two graphs in FIGS. 3A and 3B show the data acquired from the battery cell at its beginning of life (BOL), forming the anode and cathode SOC/VOC relationships, respectively. FIG. 3A gives the experimental $SOC_a/OCV_a$ relationship, while FIG. 3B gives the experimental $SOC_c/OCV_c$ relationship. The curves are digitized and saved as LUTs for later use.

Figure 4:
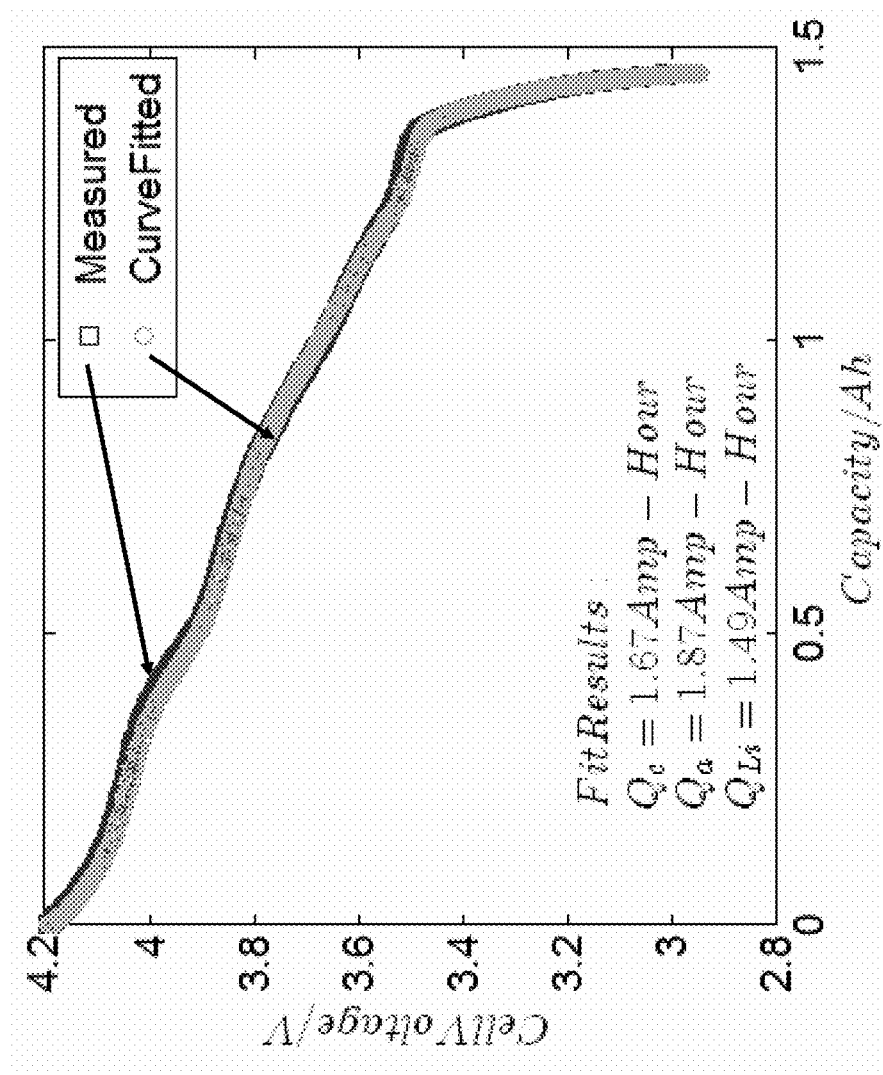
FIG. 4 plots OCV versus Q data from a cell discharged from its full capacity at a rate of C/20, in Example 1.

Deduce Each Electrode's Capacity and Active Material Capacity $Q_{Li}$ at BOL of the Cell At first we acquire Q/OCV of a battery at its BOL condition. Q represents Li charge capacity in the cathode. It is acquired by discharging the battery under the quasi-equilibrium condition. FIG. 4 shows the OCV versus Q data from a cell discharged from its full capacity at a rate of C/20 (i.e., a rate that results in a full discharge in 20 hours). From $SOC_a/OCV_a$, $SOC_c/OCV_c$, and Q/OCV, we acquire $Q_a$, $Q_c$, and $Q_{Li}$, which represent the anode capacity, cathode capacity, and Li capacity, respectively. A non-linear curve-fitting method known as multi-dimensional unconstrained non-linear minimization (Nelder-Mead) is used for acquisition of these parameters. The deduced values for the test cell are $Q_a=1.67$ Ah, $Q_c=1.87$ Ah, and $Q_{Li}=1.49$ Ah, as shown in FIG. 4.

Figure 6:
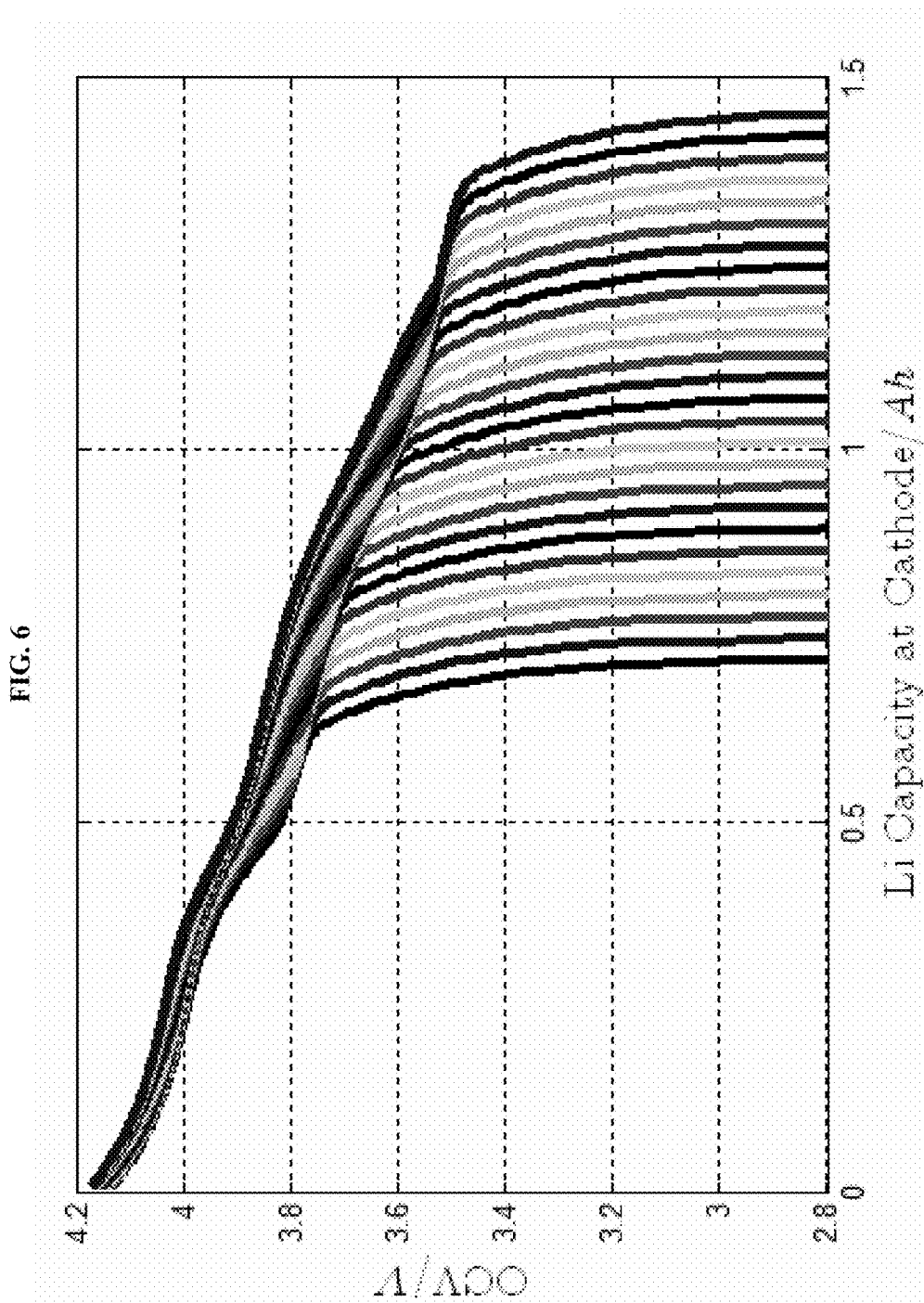
FIG. 6 illustrates a graphical view of the look-up table of FIG. 5.

Deduce OCV/Q LUTs at Different $Q_{Li}$ $Q_{Li}$ loss is the main factor determining the total capacity loss during battery aging. Since we have derived the anode capacity $Q_a$, cathode capacity $Q_c$, and the Li material capacity $Q_{Li}$ (1.87, 1.67 and 1.49 Ah respectively) based on the previous result, and since Li loss is the major factor leading to the battery capacity loss, we can deduce OCV/Q LUTs at different $Q_{Li}$ with EQ. 1. The look-up table in FIG. 5 is constructed by calculating $V_{oc}(Q)$, as Q changes from 0 to $Q_{Li}$. FIG. 5 is a Q/OCV look-up table at different $Q_{Li}$. FIG. 6 shows a graphical view of the OCV/Q relationship at different $Q_{Li}$. In FIG. 6, the $Q_{Li}$ of each curve is given by the value at OCV=2.8 V.

Figure 8:
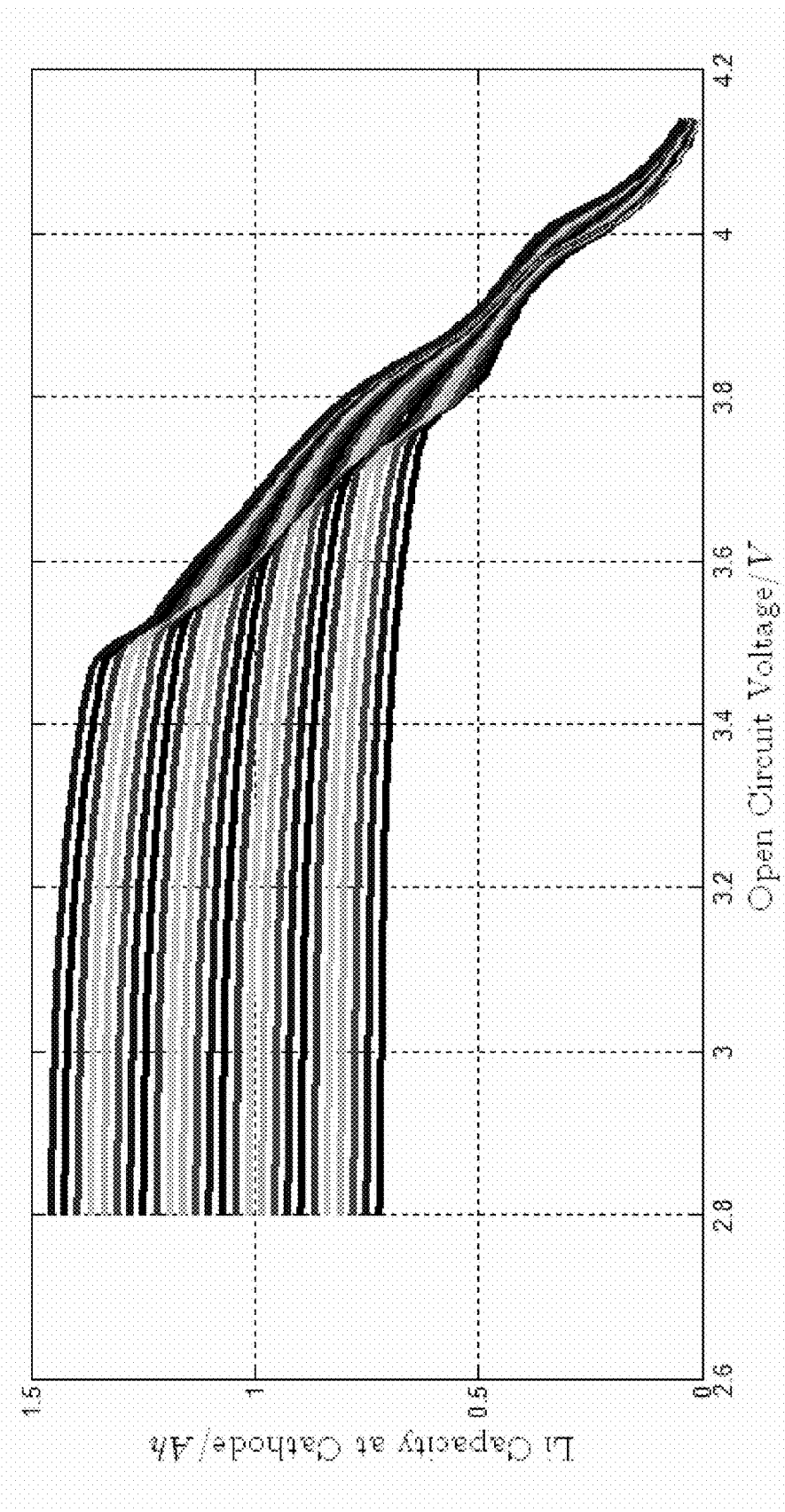
FIG. 8 illustrates a graphical view of the look-up table of FIG. 7.

In order to facilitate on-line diagnostics, a spreadsheet may be preferred, as in shown in the look-up table of FIG. 7, which was generated from the look-up table of FIG. 5 using a linear interpolation. FIG. 7 is a Q/OCV look-up table at different $Q_{Li}$. FIG. 8 shows the curves based on the look-up table of FIG. 7, demonstrating the Q/OCV relationship at different $Q_{Li}$.

FIG. 7 and/or FIG. 8 may be saved in memory and used for on-line application of battery capacity estimation. In FIG. 8, the $Q_{Li}$ of each curve is given by the value at OCV=2.8 V.

Example 2: Estimation of Battery Capacity

In this example, the look-up tables compiled in Example 1 are used to estimate the battery capacity. This procedure would typically be performed on-board during normal battery operation. As further described below, two instances are identified at which the terminal voltage corresponds to the open circuit voltage (no current flowing). The capacity is determined between these two points; Q can be measured by Coulomb counting or another method. Given two OCVs separated by a known capacity, these points can be compared with the curves (look-up tables) determined in Example 1 to identify the unique OCV vs. Q curve that contains both points. The capacity is simply the amount of active lithium ($Q_{Li}$) that corresponds to that curve.

Identify Those Instants at which the Terminal Voltages are Open Circuit Voltages This procedure is conducted and can be implemented for on-line application as the cell has been aged and $Q_{Li}$ is unknown. Two instants are identified at which the terminal voltages are equal to $V_{oc}$, and the transferred charge capacity between these two instants is estimated. Since the terminal voltage of a cell can be approximated as $V_{oc}$ if the battery has been at rest long enough to reach its equilibrium, the identification of these two instants can be easily realized by reading-in current and time signals. If current is approximately zero over some predetermined duration (e.g., 5 or 10 minutes), the terminal voltage at the end of such duration can be regarded as the battery's $V_{oc}$ at that instant.

Figure 9A:
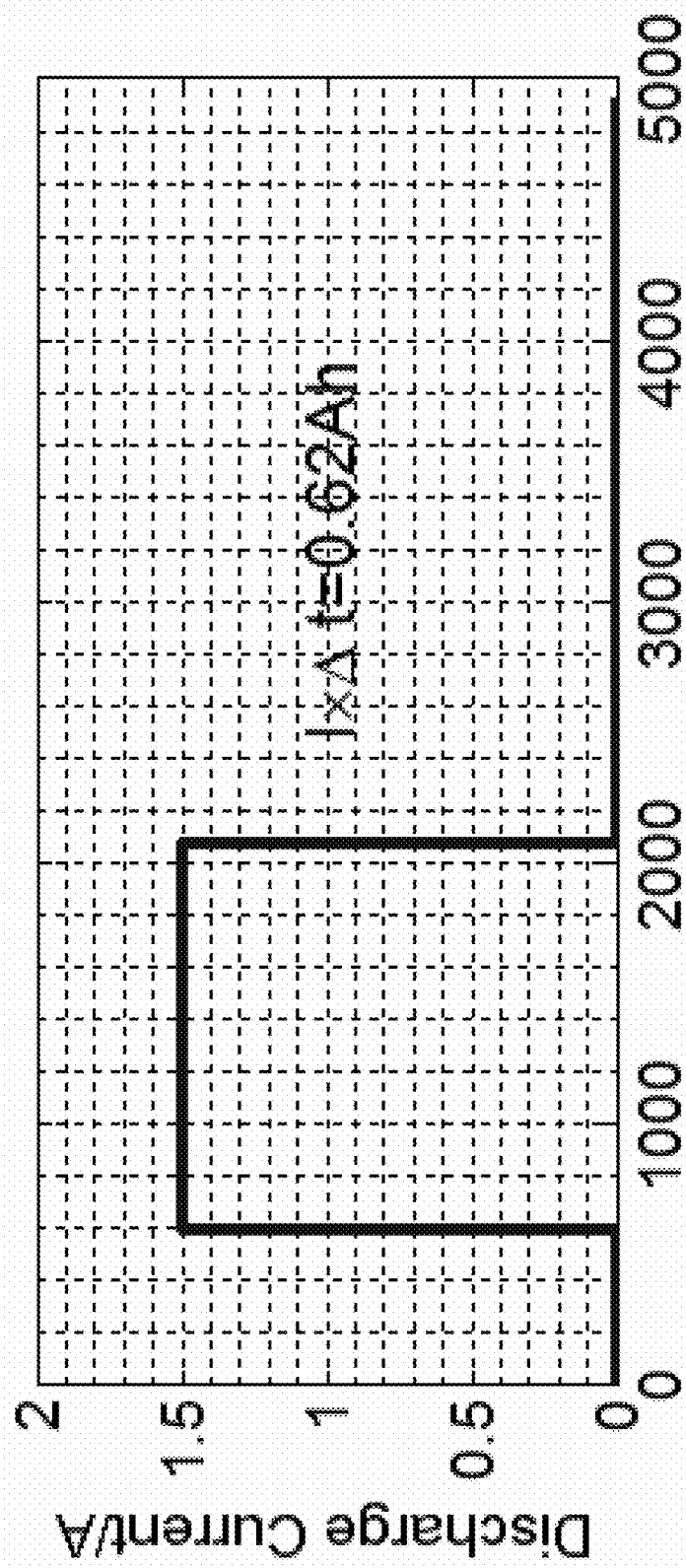
FIG. 9A shows current (amps) versus time (seconds) as the battery driving profile in Example 2.
Figure 9B:
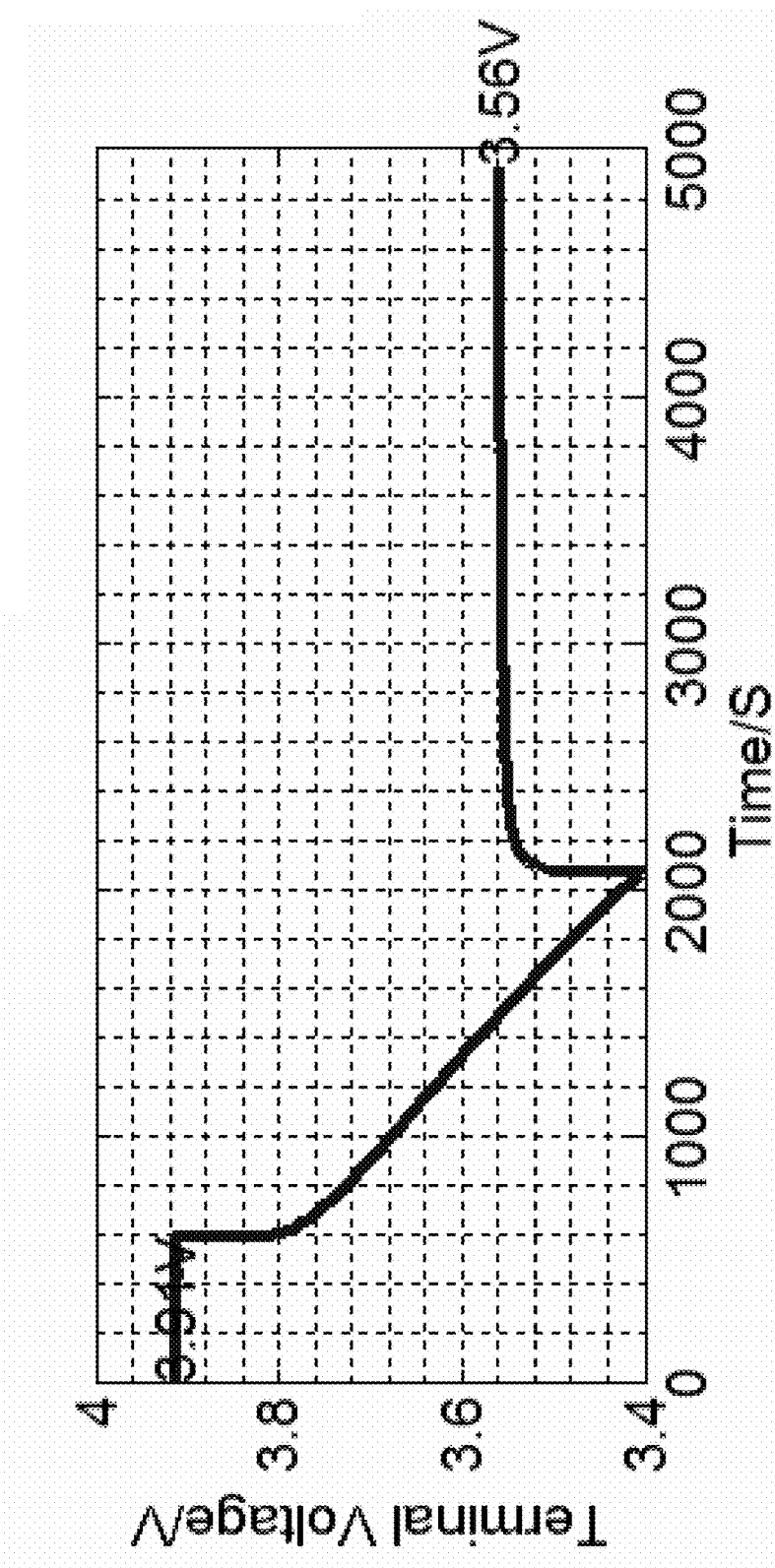
FIG. 9B shows measured voltage (volts) versus time (seconds) as the voltage profile acquired by driving an aged cell in Example 2.

As an illustration for this Example 2, a cell is cycled under a simulated vehicle environment and the I(t) driving profile and the measured V(t) profile are shown in FIGS. 9A and 9B. FIG. 9A shows the current (amps) versus time (seconds) as the battery driving profile. FIG. 9B shows the measured voltage (volts) versus time (seconds) profile acquired by driving an aged Sanyo cell described in Example 1. Two instants at t=0 and t=5000 seconds are identified, at which terminal voltages are 3.94 volts and 3.56 volts, respectively. The transferred charge capacity Q can be easily calculated as 0.62 Ah since it is constant-current pulse. Numerical integration may be used if the current profiles are more complex.

Figure 10:
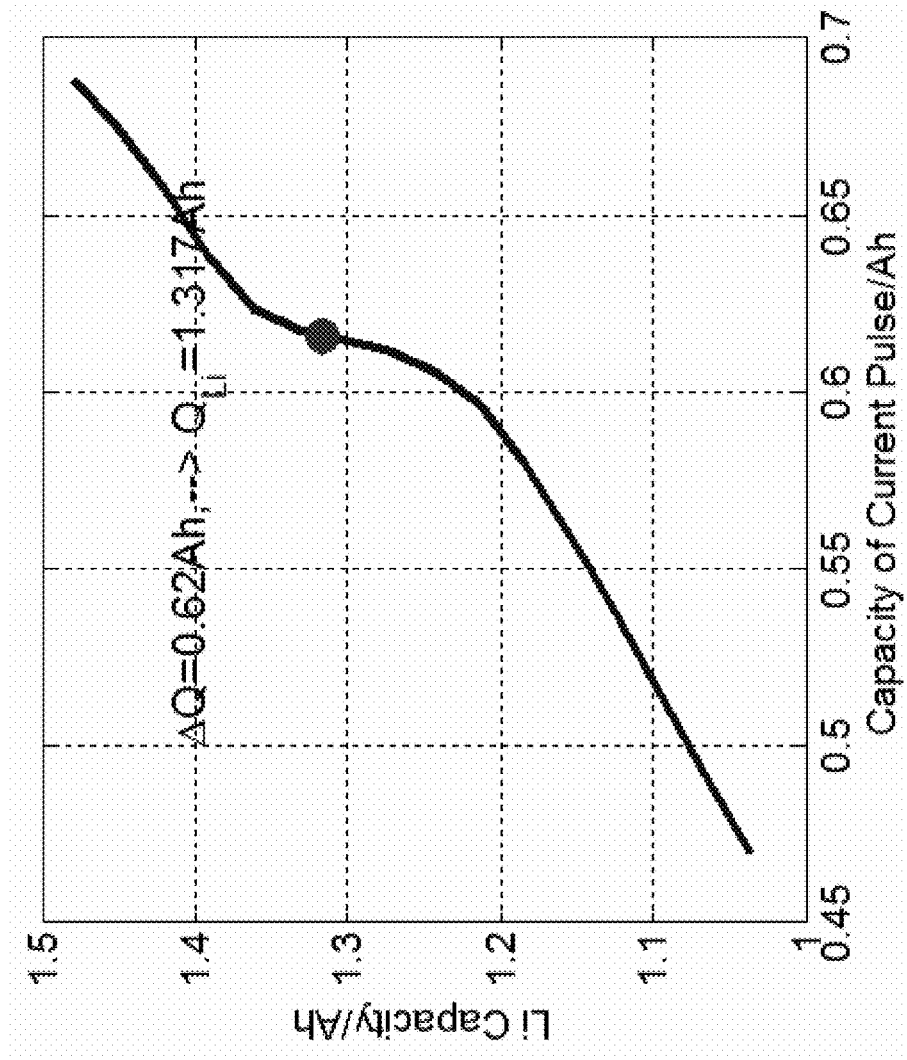
FIG. 10 plots transferred charge capacity ΔQ vs. total capacity $Q_{Li}$, in Example 2.

Identify Battery Capacity Using the Two Voltages, the Capacity, and the OCV/Q LUT For each $V_{oc}$ value, we can read out from the OCV/Q LUT two curves $Q_1/Q_{Li}$, and $Q_2/Q_{Li}$, where $Q_1$ and $Q_2$ are the Li charge at cathode at these two instances, respectively. The transferred charge capacity vs. total capacity relationship, $\Delta Q/Q_{Li}$, can be deduced by calculating the difference of $Q_1$ and $Q_2$ at the same $Q_{Li}$, with the results plotted as shown in FIG. 10. Based on the measured $\Delta Q=0.62$ Ah, referred from FIG. 9A, $Q_{Li}=1.317$ Ah, as given by the large dot in FIG. 10 which is a plot of transferred charge capacity $\Delta Q$ vs. total capacity $Q_{Li}$. Based on the measured transferred charge capacity 0.62 Ah, total capacity can be read from FIG. 10 as 1.317 Ah.

This demonstrates on-line estimation of the battery capacity. The particular aged cell has been cycled thousands of times and its capacity has decayed from 1.5 Ah at beginning of life to 1.317 Ah. For most commercial cells under normal operating conditions, the battery capacity changes slowly and will decay ~20% over the span of ten years, for example. Therefore the accuracy of $Q_{Li}$ estimation may be further improved by averaging all measurements during a week, over which period the capacity is essentially constant.

Example 3: Evaluation of On-Line Battery Capacity Diagnostics by Comparing Measured Capacities with Predicted Capacities In order to evaluate the accuracy and to compare it with other capacity prediction methods, the following experiment is conducted. The capacity of an aged cell (described in Example 1) is measured by discharging it from its maximum voltage to its minimum voltage and integrating the current over this period. This measured capacity value can be used to compare with the predicted value (such as provided by Example 2).

Figure 11:
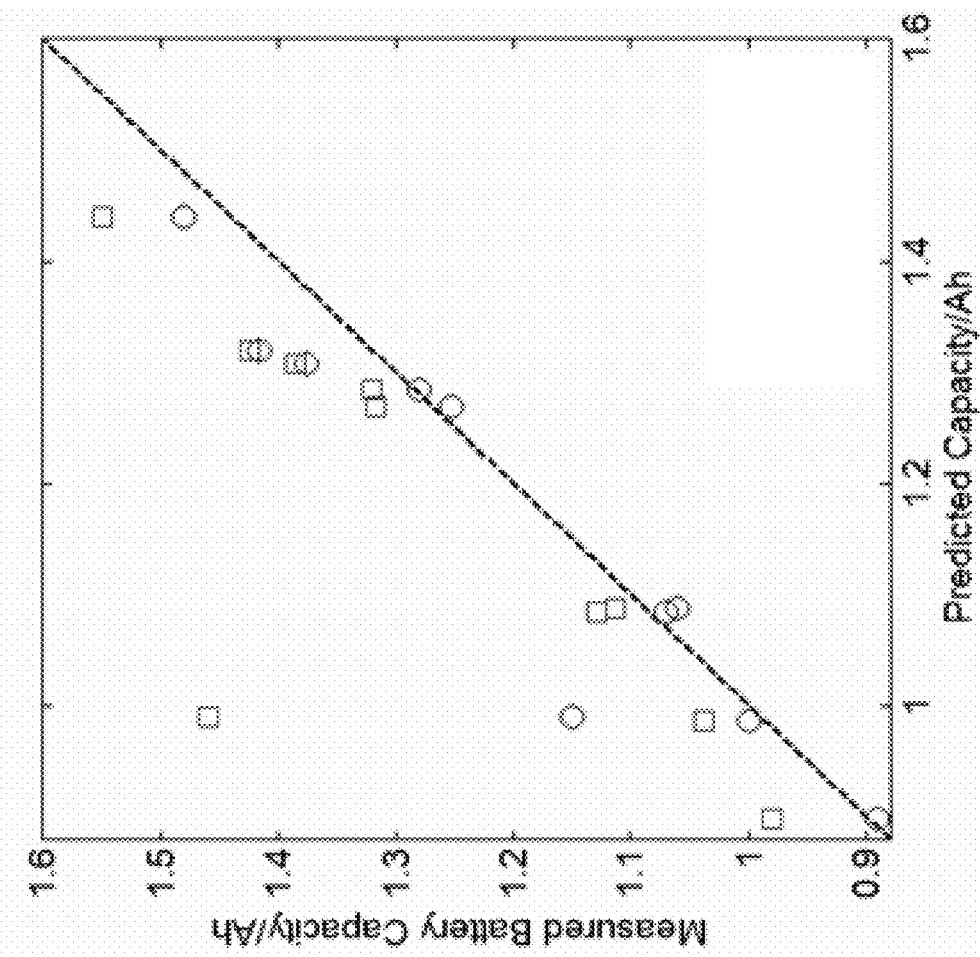
FIG. 11 gives a comparison of predicted battery capacity versus measured capacity of different aged cells, in Example 3 of the invention.

Several aged cells are evaluated, and the evaluation data are shown in FIG. 11. To compare with the conventional method of capacity prediction (using OCV/SOC LUT), we conduct capacity measurements with the conventional method and plot the results in the same figure. FIG. 11 gives a comparison of the predicted battery capacity with the measured capacity of different aged cells. The circles are based on some embodiments of the present invention, while the squares are based on the prior art. The dotted line on the graph is the line of parity (predicted=actual).

Generally the disclosed method provides better predictions than the prior art. The prior method tends to underpredict the battery capacity (data to the left of the parity line). It is believed this is due to the fact that the OCV/SOC look-up tables are actually changing during battery aging.

There are a wide variety of practical and commercial uses for the present invention. Applications include, but are not limited to, battery diagnostics for in-flight batteries on satellites, aircraft, or other aviation vehicles; real-time management of traction batteries for electric vehicles or hybrid-electric vehicles; and battery-pack management for soldier power and ground vehicles.

This invention will benefit commercial applications where battery safety, battery health, and battery life information are important. Especially for automobiles and airplanes, knowledge of battery health/life information is critical to meet customer satisfaction. Software-based battery state estimation such as battery capacity can greatly enhance the accuracy and reliability of battery management without compromising battery cost.

The current invention may also impact other commercial military and space applications such as consumer portable electronics, electric bikes, power tools, aircrafts, and satellites that can benefit from better health/life monitoring at a reduced costs. Practical applications for this invention also include, but are not limited to, laptop computers, mobile phones, cameras, medical devices, electric vehicles, electric bikes, scooters, and power tools.

In this detailed description, reference has been made to multiple embodiments and to the accompanying drawings in which are shown by way of illustration specific exemplary embodiments of the invention. These embodiments are described to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. A method of battery management with real-time monitoring of battery capacity and battery state of health in a metal-ion battery configured with an active material, an anode, a cathode, an external circuit in electrical communication with said anode and said cathode, and a battery management system linked in operable communication with said metal-ion battery, said method comprising:
   (a) correlating, in said battery management system, electrode open-circuit voltage with electrode state of charge for each of said anode and said cathode;
   (b) calculating, in said battery management system, electrode capacity for each of said anode and said cathode, and active-material capacity, wherein said method to calculate said electrode capacity and said active-material capacity comprising a non-linear curve minimization technique at the beginning of life of said battery, the non-linear curve minimization technique is a Nelder-Mead technique;
   (c) in said battery management system, compiling or obtaining a look-up table, graph, and/or equation to correlate, for each of said anode and said cathode, said electrode open-circuit voltage with said electrode capacity at different values of said active-material capacity;
   (d) in said battery management system, during real-time operation of said battery, identifying first and second times at which battery terminal voltages are approximated as battery open-circuit voltages;
   (e) calculating, in said battery management system, battery capacity based on the difference in battery open-circuit voltages at said first and second times, current integration between said first and second times, and said look-up table, graph, and/or equation provided in step (c);
   (f) estimating, in said battery management system, battery state of health based at least on said battery capacity calculated in step (e); and
   (g) utilizing said battery capacity and battery state of health in said battery management system that is in real-time communication with said metal-ion battery, wherein said battery management system is continuously updated with said battery capacity and said battery state of health to enhance battery efficiency, and wherein said battery management system adjusts electrical current between said metal-ion battery and said external circuit, in response to said battery capacity from step (e) and said battery state of health from step (f), wherein the following formula for battery open-circuit voltage as a function of capacities is utilized in said method:

$$V_{oc}(Q) = V_{oc}\left(\frac{Q}{Q_c}\right) - V_{oc}\left(\frac{Q_{Li} - Q}{Q_a}\right)$$

where $V_{oc}$ is battery open-circuit voltage, Q is battery capacity, $Q_c$ is cathode capacity, $Q_a$ is anode capacity, and $Q_{Li}$ is active-material capacity.

2. The method of claim 1, wherein said metal-ion battery is a lithium-ion battery and wherein said active-material capacity is recyclable lithium capacity.

3. The method of claim 1, wherein step (c) utilizes said look-up table to correlate said electrode open-circuit voltage with said electrode capacity at different values of said active-material capacity.

4. The method of claim 1, said method further comprising correlating the difference in said battery capacity at said first and second times with said active-material capacity, based on said battery open-circuit voltages at said first and second times and said look-up table, graph, and/or equation.

5. The method of claim 4, wherein said active-material capacity is derived from a measured difference in said battery capacity at said first and second times.

6. The method of claim 1, wherein said look-up table, graph, and/or equation to correlate said electrode open-circuit voltage with said electrode capacity at different values of said active-material capacity, is constant during operation and aging of said battery.

7. The method of claim 1, wherein said look-up table, graph, and/or equation to correlate said electrode open-circuit voltage with said electrode capacity at different values of said active-material capacity, changes over the life of the battery.

8. The method of claim 7, wherein step (a) comprises direct measurements of said electrode open-circuit voltage and said electrode state of charge.

9. The method of claim 7, wherein step (a) utilizes a beginning-of-life look-up table, graph, and/or equation along with a known voltage fade function.

10. The method of claim 1, wherein loss in said active-material capacity dominates loss in said battery capacity.

11. The method of claim 1, wherein said battery capacity is limited by amount of metal-ion inventory.

12. The method of claim 1, wherein said battery capacity is not limited by amount of metal-ion inventory; said method further comprising utilizing predetermined anode and cathode aging correlations.

13. The method of claim 1, said method further comprising predicting a future battery capacity by extrapolating, in time, said battery capacity calculated in step (e).

14. The method of claim 1, wherein said battery management system is continuously updated with said battery capacity and said battery state of health on a battery-management time scale of about one millisecond or less.

15. The method of claim 1, wherein said battery state of health includes said battery capacity as a function of battery age, said method further comprising predicting a future battery state of health by extrapolating said battery capacity as a function of battery age.

16. A method of battery management with real-time monitoring of battery capacity and battery state of health in a metal-ion battery configured with an active material, an anode, a cathode, an external circuit in electrical communication with said anode and said cathode, and a battery management system linked in operable communication with said metal-ion battery, said method comprising:
 (a) correlating, in said battery management system, electrode open-circuit voltage electrode state of charge for each of said anode and said cathode;
 (b) calculating, in said battery management system, electrode capacity for each of said anode and said cathode, and active-material capacity;
 (c) in said battery management system, compiling or obtaining a look-up table, graph, and/or equation to correlate, for each of said anode and said cathode, said electrode open-circuit voltage with said electrode capacity at different values of said active-material capacity;
 (d) in said battery management system, during real-time operation of said battery, identifying first and second times at which battery terminal voltages are approximated as battery open-circuit voltages;
 (e) calculating, in said battery management system, battery capacity based on the difference in battery open-circuit voltages at said first and second times, current integration between said first and second times, and said look-up table, graph, and/or equation provided in step (c);
 (f) estimating, in said battery management system, battery state of health based at least on said battery capacity calculated in step (e); and
 (g) utilizing said battery capacity and battery state of health in said battery management system that is in real-time communication with said metal-ion battery,
 wherein said battery management system is continuously updated with said battery capacity and said battery state of health to enhance battery efficiency, and wherein said battery management system adjusts electrical current between said metal-ion battery and said external circuit, in response to said battery capacity from step (e) and said battery state of health from step (f),
 wherein the following formula for battery open-circuit voltage as a function of capacities is utilized in said method:

$$V_{oc}(Q) = V_{oc}\left(\frac{Q}{Q_c}\right) - V_{oc}\left(\frac{Q_{Li} - Q}{Q_a}\right)$$

where $V_{oc}$ is battery open-circuit voltage, $Q$ is battery capacity, $Q_c$ is cathode capacity, $Q_a$ is anode capacity, and $Q_n$ is active-material capacity;
 wherein said look-up table, graph, and/or equation to correlate said electrode open-circuit voltage with said electrode capacity at different values of said active-material capacity, changes over the life of said battery, wherein an approximated value of said active-material capacity is utilized to compile or obtain an updated look-up table, graph, and/or equation that is more accurate than a previous look-up table, graph, and/or equation from step (c); said method comprising multiple iterations until said approximated value of said active-material capacity converges, thereby generating an accurate estimate for said battery capacity.

* * * * *